United States Patent [19]

Schade

[11] Patent Number: 4,576,670

[45] Date of Patent: Mar. 18, 1986

[54] METHOD FOR MAKING CONTACT WITH THE ELECTRODE ON THE ADHESIVE-COATED SIDE OF AN ELECTRICAL COMPONENT AND THE ARTICLE MADE BY SUCH METHOD

[75] Inventor: Reinhart Schade, Olching, Fed. Rep. of Germany

[73] Assignee: Siemens Aktiengesellschaft, Berlin & Munich, Fed. Rep. of Germany

[21] Appl. No.: 199,387

[22] Filed: Oct. 21, 1980

Related U.S. Application Data

[63] Continuation of Ser. No. 33,727, Apr. 26, 1979, abandoned.

[30] Foreign Application Priority Data

May 10, 1978 [DE] Fed. Rep. of Germany ....... 2820403

[51] Int. Cl.$^4$ ............................................ B32B 31/00
[52] U.S. Cl. ...................................... 156/219; 156/295
[58] Field of Search .................... 156/295, 219, 303.1; 428/72, 73, 119, 120, 401

[56] References Cited

U.S. PATENT DOCUMENTS

| | | | |
|---|---|---|---|
| 2,510,727 | 6/1950 | Sussenbach | 156/245 |
| 3,764,436 | 10/1973 | Schmidt et al. | 156/288 |
| 4,045,636 | 8/1977 | Yoder et al. | 428/901 |
| 4,050,756 | 9/1977 | Moore | 428/119 |
| 4,050,976 | 9/1977 | Reiters | 428/901 |
| 4,157,932 | 6/1979 | Hirata | 156/310 |
| 4,170,677 | 10/1979 | Hutcheson | 428/119 |

Primary Examiner—George F. Lesmes
Attorney, Agent, or Firm—Hill, Van Santen, Steadman & Simpson

[57] ABSTRACT

Electrical contact is made on the adhesive-side electrode of an electrical component which is connected to an electrically conductive carrying plate, with the aid of an insulating adhesive which not only ensures good contact is made, but is also suitable for automation. At one or more points the adhesive layer applied on the carrying plate before a bonding operation is pressed away by contact-forming projections during the joining and bonding operation which takes place under the influence of heat and pressure. Embossed projections on the adhesive-coated carrier plate can be used as the structure by which contact is made.

6 Claims, 7 Drawing Figures

METHOD FOR MAKING CONTACT WITH THE ELECTRODE ON THE ADHESIVE-COATED SIDE OF AN ELECTRICAL COMPONENT AND THE ARTICLE MADE BY SUCH METHOD

This is a continuation of application Ser. No. 033,727, filed Apr. 26, 1979 now abandoned.

BACKGROUND OF INVENTION

1. Field of the Invention

The present invention relates to making electrical contact between an electrically conductive carrier plate and an electrode of an electrical component, with the aid of and through an insulating adhesive.

2. Description of the Prior Art

Frequently, certain electrical components are made with a sheet of metal which is stamped into shape and serves as a carrier for an electrical element and which is securely connected to the electrical element to form a unit. For the most part, the two parts are connected together using a two-component adhesive or a fusion adhesive.

When such a carrier plate is connected, for example to a disc-shaped piezoceramic element such as is required for the oscillator disc of a timepiece or for the piezo transducer of a telephone, one refers to such structure as a sandwich plate.

In the case of the timepiece oscillator disc, as is well known in the art, the piezoceramic element has electrodes on both sides covering respective surfaces. The electrodes can be made of baked-on silver or metal coatings applied by vapor deposition. With this structure, one encounters the problem that the electrode on the adhesive side cannot be brought into contact with the carrier plate in a straightforward fashion. It is known for the carrier plate itself to be made of conductive material and for the two parts to be connected together using an adhesive of sufficiently low viscosity. Here, the difficulty arises through the fact that a sufficiently high contact pressure must be applied in order to form a satisfactory conductive connection between the carrier plate and the adhesive-side electrode. In order to ensure that, first of all, this contact pressure is not of necessity too high, and secondly, a good contact is established, an adhesive must be used which is sufficiently fluid when setting. In addition, the surface of the carrier plate must receive prior mechanical treatment in the form of roughening and/or extra scoring. This process is relatively expensive and cannot be easily automated. An adhesive suitable for this method takes 12 hours to set at 130° C. and is therefore not economical for mass production.

When the sandwich plate is used in a piezo transducer for a telephone, the sandwich plate must be mounted delicately so that the oscillations of the piezoceramic element are not influenced. For this reason, in such an application contact cannot be made with a compression spring, as is possible with the timepiece oscillator disc, so that thin small connecting wires or strips, which do not influence the oscillations, must be soldered to the electrodes. To make this possible, it is already known from German Pat. No. 2,138,563, that the adhesive-side electrode must be extended around the component onto the other side of the ceramic disc. In order to pass the electrode about the disc, the ceramic disc must be orientated during screen printing and positioned in relation to the screen configuration. This is not without problems due to the fragility of the piezoceramic element and the required accuracy of screen printing the conductor.

SUMMARY OF THE INVENTION

It is therefore the primary object of the present invention to provide an improved article and a method of making electrical contact between the adhesive-side electrode of an electrical component which is not only more simple than methods heretofore known, but which is also suitable for automation.

The above object is achieved, in an advantageous manner, according to the present invention in that, at one or more points, the adhesive layer applied on the carrier plate before bonding is pushed away by contact-forming means during the joining and bonding process, which takes place under the influence of heat and pressure. The contact-forming means may advantageously be constituted by embossed projections which extend outwardly from the carrier plate a distance which is greater than the thickness of the adhesive layer. In another embodiment of the invention, the contact-forming means may be constituted by electrically conductive elements which are placed on the adhesive-coated carrier plate before the bonding operation, the elements having a thickness which is greater than that of the adhesive layer. If the conductive elements are produced by stampings, so as to have burrs, the elements are positioned such that the burrs extend away from the conductive carrier plate.

If the electrically conductive carrier plate is not to be involved in the contact-forming operation, such as when the component is to be utilized in a telephone, it is advantageous to utilize a bright, uninsulated small connecting wire or strip as the contact-forming means, which wire or strip is positioned on the adhesive-coated carrier plate and has a thickness which is less than the thickness of the adhesive layer. This is particularly advantageous if a copolymer is used as the adhesive. A copolymer is specially suitable for economical bonding in a mass production operation since this adhesive needs only a relatively short time to set.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
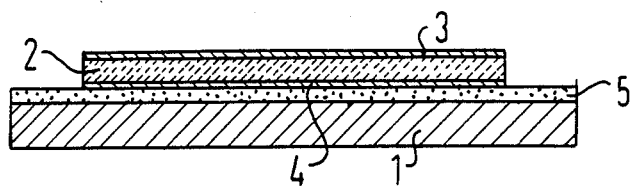
FIG. 1 is a sectional view of a timepiece oscillator disc in the form of a sandwich plate.

FIG. 1 illustrates, in a sectional view, a timepiece oscillator disc in the form of a sandwich plate. The sandwich plate consists of a carrier plate 1 made of electrically-conductive material and a disc-shaped or rectangular piezoceramic element 2 which is provided with electrodes 3 and 4 covering respective surfaces thereof. The piezoceramic element 2 with the electrodes 3 and 4 is securely joined to the carrier plate 1 by means of an adhesive 5 which is applied, in liquid form for example, on the carrier plate 1 before the bonding operation. If a contact pressure sufficiently great in relation to the viscosity of the adhesive is applied during setting, and the surface of the carrier plate 1 is roughened, the adhesive-side electrode 4 makes electrically conductive contact with the carrier plate 1. Here, contact is desired and intentional since the timepiece oscillator disc is operated simply between a rigid timepiece casing and a sprung pressure contact.

If the carrier plate 1 is constituted by a shaped element suitable for economic bonding and coated with a copolymer 5 on the one side like that disclosed in my prior application Ser. No. 937,709, filed Aug. 29, 1978 now abandoned, then the electrical contact between the electrode 4 on the adhesive side and the carrier plate 1 can only be made, without special measures, by applying a relatively large contact pressure due to the high viscosity and thickness of the adhesive 5, which would lead to breakage of the ceramic disc 2 which is normally thin.

In the example illustrated in FIG. 1, in order to make contact between the adhesive-side electrode 4 and the carrier plate 1, it is necessary to use adhesive which is adequately thin when setting. To achieve positive and reliable contact, it is also necessary to subject the carrier plate 1 to appropriate prior treatment by roughening the surface. This process is very costly and not suitable for automation.

According to the present invention, a method is provided which is advantageous over methods heretofore known in that a shaped element may be used which is coated with a copolymer as the adhesive. This technique is illustrated in FIGS. 2-5.

Figure 2:
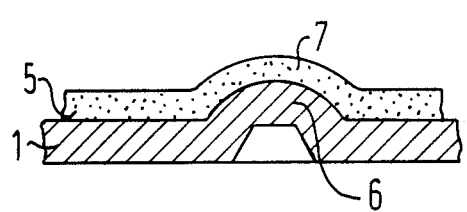
FIG. 2 is a fragmentary sectional view illustrating a carrier plate, constructed in accordance with the present invention, before bonding of the sandwich plate.

Referring to FIG. 2, the carrier plate 1 is provided with a layer of copolymer 5 prior to bonding. Before the hot-bonding process to form the sandwich plate, one or more projections 6, are embossed in the carrier plate 1 and extend a distance which is slightly greater than the thickness of the copolymer layer 5.

Figure 3:
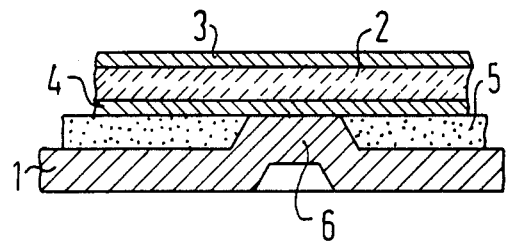
FIG. 3 is a fragmentary sectional view of a bonded sandwich plate which utilizes the structure of FIG. 2.

FIG. 3 illustrates the sandwich plate with the contact made after the hot-bonding operation. The adhesive dome 7 formed over the projection 6, as illustrated in FIG. 2, is forced to the side and completely compressed into the plasticised adhesive layer 5 when the piezoceramic element 2 with the electrodes 3 and 4 is pressed down on the heated carrier plate 1. Since the embossed projection 6 extends a distance greater than the thickness of the adhesive layer, a positive electrical contact is formed between the electrode 4 on the adhesive side of the component and the carrier plate 1. Preferably, the pressing die required to press the piezoceramic element onto the carrier plate is made of a hard metal so that the embossed projection 6 is forced back a small amount as illustrated in FIG. 3 as a flattening of the dome shape of the projection 6.

Figure 4:
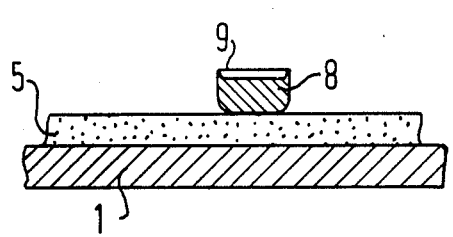
FIG. 4 illustrates the utilization of conductive stampings, in a fragmentary sectional view, prior to bonding of a sandwich plate.
Figure 5:
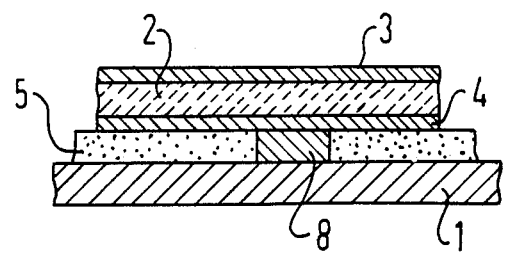
FIG. 5 illustrates the structure of FIG. 4, in a fragmentary section view, of a bonded sandwich plate.

Referring to FIGS. 4 and 5, FIG. 4 illustrates the state before hot-bonding and FIG. 5 illustrates the state after hot-bonding. In this case, once again, a carrier plate 1 is provided with a copolymer layer 5, and before joining and bonding, one or more electrically conductive stampings 8, having a thickness greater than the thickness of the adhesive layer 5, are placed on the adhesive layer 5. Preferably, the stamping 8 is placed on the adhesive layer 5 so that burrs 9 formed during stamping are directed away from the adhesive layer 5. When the piezoceramic element 2 is pressed onto the heated carrier plate 1, the stamping 8 is forced through the adhesive layer 5. The typical form of the stamping 8 penetrates the plasticised adhesive layer 5 and lateral compression of the adhesive occurs during the bonding operation. As illustrated in FIG. 5, after the bonding operation, the burr 9 formed during stamping process is partially compressed and partially forced into the electrode 4, thereby producing a good electrical contact between the adhesive-side electrode 4 and the carrier plate 1. Therefore, the method of making an article in accordance with the present invention permits the use of a copolymer as an adhesive, which, compared with other known adhesives, has the advantage of requiring a lower temperature and a much shorter setting time.

Figure 6:
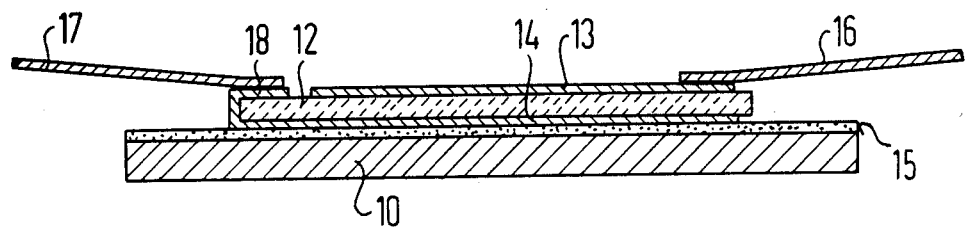
FIG. 6 illustrates, in a sectional view, a sandwich plate constructed for use in a piezo transducer of a telephone.

A known exemplary embodiment in which particular use is made of the insulating properties of the copolymer is described with reference to FIGS. 6 and 7. FIG. 6 illustrates, in a sectional view, a conventional piezo transducer for a telephone. A carrier plate 10 has a copolymer layer 15 applied on one side thereof. With the aid of this adhesive layer 15 a piezoceramic disc 12, provided with electrodes 13 and 14, is joined to form a sandwich. As this sandwich must be mounted delicately and, therefore, contact cannot be made using a pressure spring, as is possible with the structures of FIGS. 1-5, thin small connecting wires or strips 16 and 17 must be soldered to the electrodes 13 and 14. For this reason, the adhesive-side electrode 14 is extended about the edge of the piezoceramic disc 12 as indicated at 18. This type of electrode arrangement is known in the art, for example from German Pat. No. 2,138,563. However, the attachment of such electrodes is expensive. When screen printing the conductors, for example, the ceramic discs must be centered and positioned in relation to the screen configuration. This is not without problems, given the fragility of the material being printed and the required precision. If the electrodes are applied by vapor deposition, zones which are to be free of metal must be masked.

Figure 7:
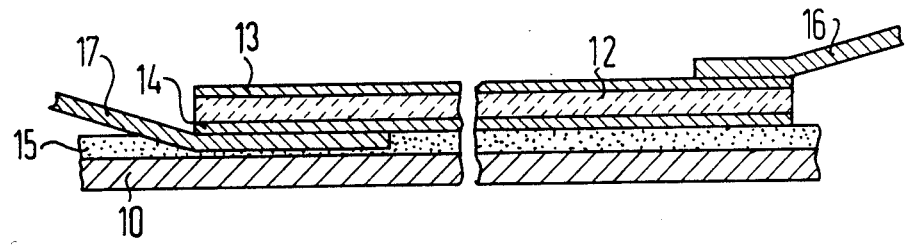
FIG. 7 illustrates a similar sandwich plate, constructed in accordance with the present invention, for delicate mounting, as in the transducer of a telephone.

Referring now to FIG. 7, an exemplary embodiment constructed in accordance with the present invention is illustrated in which electrodes covering the entire area, as in the exemplary embodiments of FIGS. 1-5, can be used. Elements having the same functions have been given the same reference characters in FIG. 6. Therefore, in order to make contact with the simplied adhesive-side electrode 14 which does not extend over to the surface of the piezoceramic component, a small bright uninsulated wire or strip 17 is employed, which wire strip 17 is somewhat thinner than the adhesive layer 15, since the adhesive-side electrode 14 is not required to make electrical contact with the carrier plate 10. The small strip 17 is placed either in part alone or with its entire diameter under the ceramic disc 12 which is to be bonded. Preferably, a hard metal pressing die is used to press the piezoceramic disc 12 in position so as to avoid cracking the normally thin device. Since the preferred copolymer 15 is not fluid during the hot-bonding operation at about 120° C., the adhesive does not flow between the surfaces of the electrode 14 and the strip 17 between which contact is to be made. Contact is made with the second electrode 13, as was heretofore done, by means of a soldered strip 16.

Although I described my invention by reference to particular illustrative embodiments thereof, many changes and modifications of the invention may become apparent to those skilled in the art without departing from spirit and scope of the invention. I therefore intend to include within the patent warranted hereon all such changes and modifications as may reasonably and properly be included within the scope of my contribution to the art.

I claim:

1. A method of making contact with an electrode of an electrical component which is bonded by an insulating adhesive layer to an electrically conductive carrier plate, comprising the steps of:
    applying an insulating adhesive layer to the carrier plate;
    prior to bonding, providing a contact element in the area of the adhesive layer by embossing the carrier plate a distance greater than the thickness of the adhesive layer so that the embossment constitutes the contact element and contact is made between the carrier plate and the electrode during bonding; and
    applying heat and pressure to the component and the carrier plate to cause the adhesive material to be displaced by the contact element and bond the carrier plate, the contact element and the electrode.

2. A method of making contact with an electrode of an electrical component which is bonded by an insulating adhesive layer to an electrically conductive carrier plate, comprising the steps of:
    prior to bonding, providing a bright, uninsulated conductor having a thickness selected to be less than the thickness of the insulating adhesive layer as a contact element in the area of the adhesive layer; and
    applying heat and pressure to the component and the carrier plate to cause the adhesive material to be displaced by the contact element and bond the carrier plate, the contact element and the electrode with the contact element insulated from the carrier plate and in electrical contact with the electrode.

3. A method of making contact with an electrode of an electrical component which is bonded by an insulating adhesive layer to an electrically conductive carrier plate, comprising the steps of:
    applying an insulating adhesive layer to the carrier plate;
    prior to bonding, providing a bright, uninsulated conductor in the area of the adhesive layer as the contact element; and
    applying heat and pressure to the component and the carrier plate to cause the adhesive material to be displaced by the contact element and bond the carrier plate, the contact element and the electrode.

4. A method of making contact with an electrode of an electrical component which is bonded by an insulating adhesive layer to an electrically conductive carrier plate, comprising the steps of:
    applying an insulating adhesive layer to the carrier plate;
    forming a contact element to have sharp edges on one side by stamping the contact element from a sheet of metal which has a thickness slightly greater than the thickness of the adhesive layer so that both the electrode and the carrier plate are contacted during subsequent bonding;
    prior to bonding, providing the contact element in the area of the adhesive layer with the sharp edges oriented toward the electrode; and
    applying heat and pressure to the component and to the carrier plate to cause the adhesive material to be displaced by the contact element and bond the carrier plate, the contact element and the electrode.

5. The method of claim 4, wherein the step of embossing is further defined as:
    pressing an arcuate-shaped mound portion in the carrier plate; and
    the step of applying pressure includes the further step of: flattening the arcuate-shaped mound portion.

6. The method of claim 5, wherein the thickness of the conductor is selected to be less than the thickness of the insulating adhesive layer.

* * * * *